US011830753B2

(12) United States Patent
Miyanishi et al.

(10) Patent No.: US 11,830,753 B2
(45) Date of Patent: Nov. 28, 2023

(54) COMPOSITE SINTERED BODY, SEMICONDUCTOR MANUFACTURING APPARATUS MEMBER AND METHOD OF PRODUCING COMPOSITE SINTERED BODY

(71) Applicant: NGK INSULATORS, LTD., Nagoya (JP)

(72) Inventors: Keita Miyanishi, Anjo (JP); Kyohei Atsuji, Nagoya (JP); Asumi Nagai, Okazaki (JP); Hirofumi Yamaguchi, Kasugai (JP); Soichiro Aoyagi, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 119 days.

(21) Appl. No.: 17/447,102

(22) Filed: Sep. 8, 2021

(65) Prior Publication Data
US 2022/0084865 A1 Mar. 17, 2022

(30) Foreign Application Priority Data

Sep. 14, 2020 (JP) ................................. 2020-153841
Jun. 25, 2021 (JP) ................................. 2021-105533

(51) Int. Cl.
*H01L 21/683* (2006.01)
*B32B 37/06* (2006.01)
*C04B 22/06* (2006.01)
*C04B 22/04* (2006.01)
*B32B 9/00* (2006.01)

(52) U.S. Cl.
CPC ........... *H01L 21/6833* (2013.01); *B32B 9/005* (2013.01); *B32B 37/06* (2013.01); *C04B 22/04* (2013.01); *C04B 22/06* (2013.01)

(58) Field of Classification Search
CPC ......... B32B 37/06; B32B 18/00; B32B 9/005; C04B 22/04; C04B 22/06; C04B 37/001; C04B 37/021; C04B 35/111; C04B 2237/125; C04B 2237/343; C04B 2235/9607; C04B 2235/3206; H01L 21/6833; H01L 21/68757; H01L 21/6831
USPC ......................................................... 361/234
See application file for complete search history.

(56) References Cited

U.S. PATENT DOCUMENTS

2017/0117175 A1* 4/2017 Katsuda ................ C04B 37/006

FOREIGN PATENT DOCUMENTS

WO 2016/042957 A1 3/2016

* cited by examiner

*Primary Examiner* — Kevin J Comber
(74) *Attorney, Agent, or Firm* — BURR PATENT LAW, PLLC

(57) ABSTRACT

A composite sintered body includes a base material that contains $Al_2O_3$ as a main component, and an electrode arranged inside or on a surface of the base material. The electrode contains Ru, $ZrO_2$, and $Al_2O_3$.

13 Claims, 3 Drawing Sheets

COMPOSITE SINTERED BODY, SEMICONDUCTOR MANUFACTURING APPARATUS MEMBER AND METHOD OF PRODUCING COMPOSITE SINTERED BODY

CROSS REFERENCE TO RELATED APPLICATION

This application claims priority benefit of Japanese Patent Applications No. 2020-153841 filed in the Japan Patent Office on Sep. 14, 2020 and No. 2021-105533 filed in the Japan Patent Office on Jun. 25, 2021, the entire disclosures of which are incorporated herein by reference.

TECHNICAL FIELD

The present invention relates to a composite sintered body, a semiconductor manufacturing apparatus member, and a method of producing a composite sintered body.

BACKGROUND ART

Semiconductor substrate manufacturing apparatuses and the like have conventionally used susceptors such as electrostatic chucks for absorbing and holding semiconductor substrates, heaters for heating semiconductor substrates, and electrostatic chuck heaters serving as combinations of electrostatic chucks and heaters. Such a susceptor includes a base material using a ceramic sintered body as a main component, and an electrode arranged, for example, inside the base material. The electrode is ordinarily made using metal as a main component in order to reduce resistivity.

The aforementioned susceptor is formed by, for example, integrally firing the base material and the electrode. The firing may produce an adverse effect resulting from a difference in thermal expansion coefficient between the base material and the electrode. For example, cracks may occur in the base material, or the electrode may be delaminated from the base material. In the case where the base material has a small thickness, warpage may occur in the base material.

In view of this, International Publication No. 2016/042957 (Document 1) proposes a technique for suppressing warpage in a ceramic base, which is a sintered body of aluminum oxide or rare earth metal oxide, by using ruthenium as a principal component of an electrode provided on the ceramic base and adding zirconium oxide, titanium nitride, or aluminum oxide as a filler component to the ceramic base in order to reduce the difference in thermal expansion coefficient between the ceramic base and the electrode.

Meanwhile, in the case where a paste serving as an electrode material is printed on a surface of a base material and integrally fired with the base material in the process of producing a susceptor, the paste may be drawn in the base material by suction and cause an uneven distribution of a specific component in the electrode material toward the base material. For example, in the case of using an electrode with zirconium oxide added to ruthenium as in Document 1, if firing is conducted under a condition in which zirconium oxide in the paste is unevenly distributed toward the base material, the difference in thermal expansion coefficient between the electrode and the base material may increase locally, and problems such as cracks in the base material or delamination of the electrode may occur. The aforementioned uneven distribution of zirconium oxide is considered to be caused by the ruthenium in the paste having relatively large particle diameters (e.g., a dozen or so micrometers) as compared to zirconium oxide having small particle diameters (e.g., 0.1 μm) because ruthenium is excellent in malleability and not easy to pulverize.

SUMMARY OF INVENTION

The present invention is intended for a composite sintered body, and it is an object of the present invention to suppress an uneven distribution of a specific component in an electrode.

A composite sintered body according to a preferable embodiment of the present invention includes a base material that contains aluminum oxide as a main component, and an electrode arranged inside the base material or on a surface of the base material. The electrode contains ruthenium, zirconium oxide, and aluminum oxide.

This composite sintered body enables suppressing an uneven distribution of the zirconium oxide in the electrode.

Preferably, an absolute value for a difference in thermal expansion coefficient between the electrode and the base material is less than or equal to 0.3 ppm/° C. at a temperature within a range higher than or equal to 40° C. and lower than or equal to 1000° C.

Preferably, the electrode has resistivity lower than or equal to $3.0 \times 10^{-5}$ Ω·cm at a room temperature.

Preferably, a total content of the zirconium oxide and the aluminum oxide in the electrode is higher than or equal to 20% by volume.

Preferably, a content of the aluminum oxide in the electrode is 0.2 times or more and 3.6 times or less a content of the zirconium oxide in the electrode.

Preferably, a content of the aluminum oxide in the electrode is more than 3.6 times and 3.8 times or less a content of the zirconium oxide in the electrode.

Preferably, a total content of the ruthenium, the zirconium oxide, and the aluminum oxide in a solid-state material of the electrode is 100% by volume.

Preferably, a ratio between a main peak intensity of the ruthenium and a main peak intensity of the zirconium oxide in the electrode is higher than or equal to 0.80 and lower than 1.0, the ratio being obtained by X-ray diffractometry.

Preferably, when a sectional SEM image of the electrode that is taken parallel to a thickness direction of the electrode is divided into three equal parts and if the three equal parts are respectively referred to as a first region, a second region, and a third region in order from one side in the thickness direction, an area of the zirconium oxide in the second region located in a center is 0.5 times or more and 2.0 times or less the area of the zirconium oxide in the first region located between the second region and the base material.

Preferably, an adhesion strength of the electrode to the base material is higher than or equal to 90 MPa.

The present invention is also intended for a semiconductor manufacturing apparatus member for use in a semiconductor manufacturing apparatus. The semiconductor manufacturing apparatus member is produced using the composite sintered body described above. The base material has a disk-like shape and has a main surface on which a semiconductor substrate is placed.

The present invention is also intended for a method of producing a composite sintered body. The method of producing a composite sintered body includes a) preparing a first member and a second member that are each one of a green body, a calcined body, and a sintered body that contains aluminum oxide as a main component, b) drying the first member by application of a paste electrode material that contains ruthenium, zirconium oxide, and aluminum oxide to the first member, c) laminating the second member on the first member to form a laminate, and d) firing the laminate by hot pressing.

Preferably, the first member in the operation a) is either a calcined body or a tape cast.

Preferably, an absolute value for a difference in thermal expansion coefficient between the electrode and the first member after completion of the operation d) is less than or equal to 0.3 ppm/° C. at a temperature within a range higher than or equal to 40° C. and lower than or equal to 1000° C.

Preferably, a firing temperature in the operation d) is higher than or equal to 1550° C. and lower than or equal to 1650° C.

These and other objects, features, aspects and advantages of the present invention will become more apparent from the following detailed description of the present invention when taken in conjunction with the accompanying drawings.

DESCRIPTION OF EMBODIMENTS

Figure 1:
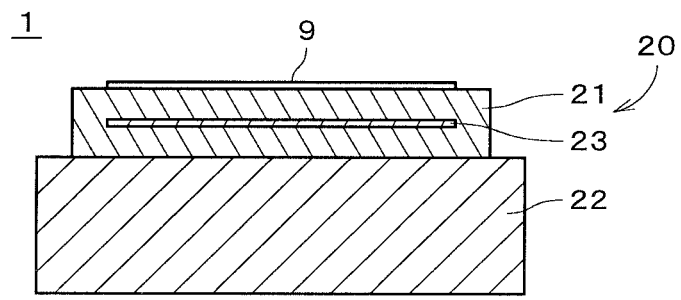
FIG. 1 is a sectional view of a susceptor according to one embodiment.

FIG. 1 is a sectional view of a susceptor 1 according to one embodiment of the present invention. The susceptor 1 is a semiconductor manufacturing apparatus member for use in a semiconductor manufacturing apparatus. The susceptor 1 supports a generally disk-like semiconductor substrate 9 (hereinafter, simply referred to as a "substrate 9") from the underside in FIG. 1. In the following description, the upper and lower sides in FIG. 1 are simply referred to as the upper and lower sides. The up-down direction in FIG. 1 is also simply referred to as the up-down direction. The up-down direction in FIG. 1 does not necessarily have to match the actual up-down direction when the susceptor 1 is installed in a semiconductor manufacturing apparatus.

The susceptor 1 includes a main body 21, a base part 22, and an electrode 23. The main body 21 is a generally plate-like (e.g., generally disk-like) base material that contains ceramic as a main component. The main body 21 has an upper main surface (i.e., upper face) on which the substrate 9 is placed. The base part 22 is a generally plate-like (e.g., generally disk-like) member that is larger than the main body 21 in plan view. The main body 21 is mounted on the base part 22. In the example illustrated in FIG. 1, the electrode 23 is arranged inside (i.e. embedded in) the main body 21. For example, the electrode 23 may be a generally band-like member shaping a predetermined pattern in plan view. The electrode 23 is preferably formed of a material having a relatively high melting point. The main body 21 and the electrode 23 constitute a composite sintered body formed of a plurality of materials. In the following description, the main body 21 and the electrode 23 are also collectively referred to as a "composite sintered body 20."

The materials for the main body 21 and the electrode 23 will be described later. Note that the electrode 23 may vary in shape. The electrode 23 may be provided on a surface of the main body 21.

In the example illustrated in FIG. 1, the susceptor 1 serves as a heater that heats the substrate 9 by heat generated as a result of the application of a direct-current voltage to the electrode 23. That is, the electrode 23 serves as a heating resistor that heats the substrate 9. The main body 21 of the susceptor 1 may further include, in addition to the electrode 23, a chuck electrode that electrostatically adsorbs the substrate 9 by the Coulomb force or the Johnson-Rahbek force. Alternatively, the electrode 23 may be used as such a chuck electrode.

The main body 21 is formed using aluminum oxide ($Al_2O_3$) as a main component. The main body 21 may also contain additives such as magnesium oxide (MgO) and/or magnesium-aluminum spinel ($MgAl_2O_4$) in $Al_2O_3$. The content of $Al_2O_3$ serving as a main component in the main body 21 is in the range of 95% by mass to 100% by mass, and this content is adjusted in accordance with material characteristics of the desired main body 21.

The electrode 23 contains ruthenium (Ru), zirconium oxide ($ZrO_2$), and $Al_2O_3$. In the present embodiment, a solid-state material in the electrode 23 is substantially formed of only Ru, $ZrO_2$, and $Al_2O_3$. In other words, a total content of Ru, $ZrO_2$, and $Al_2O_3$ in the solid-state material of the electrode 23 (hereinafter, also simply referred to as "in the electrode 23") is 100% by volume.

A total content of $ZrO_2$ and $Al_2O_3$ in the electrode 23 may, for example, be in the range of 10% by volume to 65% by volume. This total content is preferably higher than or equal to 20% by volume. The $Al_2O_3$ content in the electrode 23 may, for example, be 0.2 times or more and 3.6 times or less the $ZrO_2$ content. In other words, a value obtained by dividing the $Al_2O_3$ content in the electrode 23 by the $ZrO_2$ content (hereinafter, also referred to as an "$Al_2O_3/ZrO_2$ content ratio") is greater than or equal to 0.2 and less than or equal to 3.6. For example, the $Al_2O_3$ content in the electrode 23 may be more than 3.6 times and less than or equal to 3.8 times the $ZrO_2$ content. That is, the $Al_2O_3/ZrO_2$ content ratio is higher than or equal to 0.2 and lower than or equal to 3.8. The $Al_2O_3/ZrO_2$ content ratio is preferably higher than or equal to 0.3 and lower than or equal to 1.3.

In the electrode 23, the ratio between a main peak intensity of Ru and a main peak intensity of $ZrO_2$ (hereinafter, also referred to as an "Ru—$ZrO_2$ peak ratio"), obtained by X-ray diffractometry (XRD), may for example be higher than or equal to 0.80 and lower than 1.0 and is adjusted such that a difference in thermal expansion coefficient between the electrode 23 and the main body 21 approaches substantially zero. The Ru—$ZrO_2$ peak ratio is the value obtained by dividing the main peak intensity of Ru by a total of the main peak intensity of Ru and the main peak intensity of $ZrO_2$.

The thermal expansion coefficient (also referred to as "thermal expansivity") of Ru is 7.6 ppm/° C. (i.e., ppm/K) at temperatures within a range higher than or equal to 40° C. and lower than or equal to 1000° C. If there are no descriptions about temperature conditions, thermal expansion coefficients in the following description refer to thermal expansion coefficients at temperatures within the range higher than or equal to 40° C. and lower than or equal to 1000° C. The thermal expansion coefficient of $ZrO_2$ is 10.5 ppm/° C. The thermal expansion coefficient of $Al_2O_3$ is 8.1 ppm/° C. The thermal expansion coefficient of the main body 21 varies depending on the type and ratio of the additives added to $Al_2O_3$ serving as a main component and may, for example, be in the range of 8.1 ppm/° C. to 8.3 ppm/° C.

The thermal expansion coefficient of Ru contained in the electrode 23 is lower than the thermal expansion coefficient of the main body 21. The thermal expansion coefficient of $ZrO_2$ contained in the electrode 23 is higher than the thermal expansion coefficient of the main body 21. The thermal expansion coefficient of $Al_2O_3$ contained in the electrode 23 is approximately the same as the thermal expansion coefficient of the main body 21. An absolute value for the difference in thermal expansion coefficient between the electrode 23 and the main body 21 (hereinafter also referred to as a "CTE difference") may, for example, be less than or equal to 0.3 ppm/° C. and preferably less than or equal to 0.2 ppm/° C. at temperatures within the range higher than or equal to 40° C. and lower than or equal to 1000° C. There are no particular limitations on a lower limit for the CTE difference, and the lower limit may be higher than or equal to 0.0 ppm/° C.

The electrode 23 has resistivity less than or equal to $3.0 \times 10^{-5}$ Ω·cm and preferably less than or equal to $2.5 \times 10^{-5}$ Ω·cm at a room temperature. There are no particular limitations on a lower limit for the resistivity, and the lower limit may, for example, be higher than or equal to $1.0 \times 10^{-5}$ Ω·cm.

Adhesion strength of the electrode 23 to the main body 21 (hereinafter, also simply referred to as "adhesion strength") is preferably higher than or equal to 50 MPa and more preferably higher than or equal to 90 MPa. There are no particulate limitations on an upper limit for the adhesion strength of the electrode 23, and the upper limit may, for example, be lower than or equal to 300 MPa. The adhesion strength of the electrode 23 is the value obtained by dividing the shear fracture force of first and second members of the main body 21 by the area of the electrode. The shear fracture force of the first and second members refers to the shear fracture force when the first and second members are displaced in a direction parallel to the joint surface of the first and second members (i.e., the shear force when the electrode 23 is delaminated from the first and/or the second members).

Figure 2:
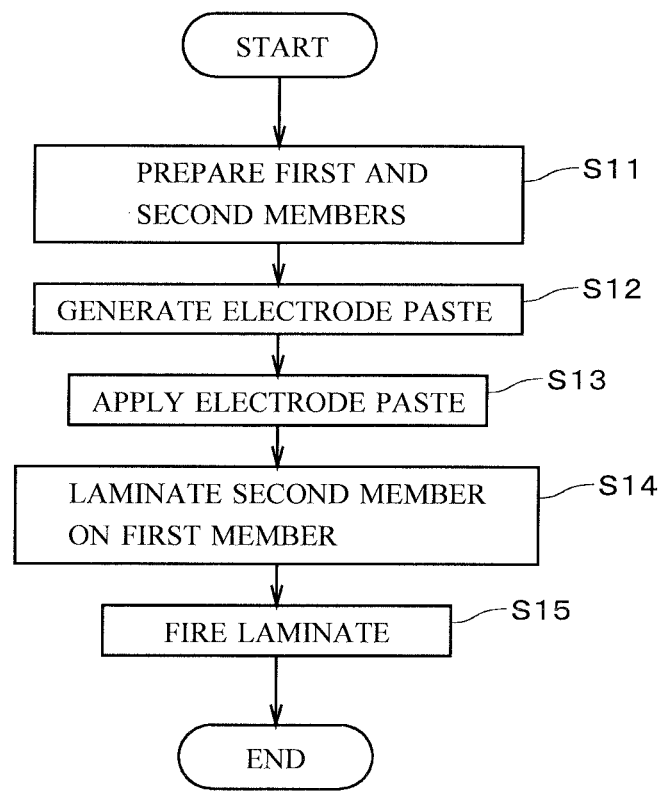
FIG. 2 is a flowchart of production of a composite sintered body.

Next, one example of a method of producing the main body 21 and the electrode 23 (i.e., the composite sintered body 20) of the susceptor 1 will be described with reference to FIG. 2. In the present example, the main body 21 and the electrode 23 are produced by producing a generally disk-like lower half portion (hereinafter, referred to as a "first member") and a generally disk-like upper half portion (hereinafter, referred to as a "second member") of the main body 21, sandwiching a material for the electrode 23 between the first and second members, and firing the first and second members with the electrode 23 therein.

In the production method, first, the first and second members of the main body 21 are prepared (step S11). The first and second members prepared in step S11 may be in any of the following states: a green body, a calcined body, and a sintered body. In step S11, first, base powder of the main body 21 (i.e., the first and second members) is weighed so as to have a predetermined composition, and this base powder is subjected to wet mixing and is molded into a green body of a predetermined shape by processing such as uniaxial pressure molding.

In step S11, for example, commercially available high-purity particulate powder is used as an $Al_2O_3$ raw material. In the case where the main body 21 contains MgO, for example, commercially available high-purity particulate powder is used as an MgO raw material. In the case where the main body 21 contains $MgAl_2O_4$, for example, powder obtained by heating and combining the aforementioned commercially available powder of MgO and the aforementioned commercially available high-purity particulate powder of $Al_2O_3$ is used as an $MgAl_2O_4$ raw material. Alternatively, commercially available high-purity particulate powder of $MgAl_2O_4$ may be used as the $MgAl_2O_4$ raw material. Conditions such as the degrees of purity and average particle diameters of the $Al_2O_3$, MgO, and $MgAl_2O_4$ raw materials are appropriately determined.

In step S11, conditions for mixing the base powder (e.g., mixing time and solvent type) are appropriately determined. For example, an organic solvent or ion-exchanged water may be used as the solvent. Alternatively, in step S11, the base powder may be mixed by dry mixing.

In step S11, conditions for molding a green body (e.g., pressure to be applied) are appropriately determined. In the case where the green body is formed into a plate-like shape, the base powder may be charged into a hot pressing die or any other mold to form the green body. Other various methods can be used to mold as long as the shape of the green body can be maintained. For example, slurry that has undergone wet mixing may be poured into a mold while being kept in a flowable state, and then a solvent component may be removed to form a green body of a predetermined shape. As another alterative, a tape cast of a predetermined shape may be formed by tape casting using a doctor blade or a similar instrument.

In the case of preparing a calcined or sintered body(ies) of the first and/or second member(s) in step S11, the green body formed by the aforementioned method is fired by hot pressing or other techniques to form the calcined body (i.e., temporary-sintered body) or the sintered body. Firing conditions for firing the green body (e.g., press pressure, firing temperature, and firing time) are appropriately determined. Other methods different from hot pressing may be used to fire the green body.

Next, base powder for the electrode 23 is weighed so as to have a predetermined composition, and this base powder is mixed and kneaded with materials such as a solvent and a binder to generate an electrode paste that serves as a precursor of the electrode 23 (step S12). In step S12, for example, commercially available high-purity particulate powder is used as each of the Ru, $ZrO_2$, and $Al_2O_3$ raw materials. Conditions such as the degrees of purity and average particle diameters of the Ru, $ZrO_2$, and $Al_2O_3$ raw materials are appropriately determined. The average particle diameter of the Ru raw material may, for example, be a dozen or so micrometers because Ru is excellent in malleability and not easy to pulverize. The average particle diameters of the $ZrO_2$ and $Al_2O_3$ raw materials each may, for example, be less than 1 μm.

The mixing of the aforementioned base powder for the electrode 23 is implemented by, for example, wet mixing. Conditions for mixing the base powder (e.g., mixing time and solvent type) are appropriately determined. For example, an organic solvent or ion-exchanged water may be used as the solvent. Alternatively, the base powder may be mixed by dry mixing in step S12. In step S12, the types of the solvent (e.g., organic solvent) and the binder described above, which are to be kneaded together with the base powder, are appropriately determined. Note that step S12 may be performed prior to step S11, or may be performed in parallel with step S11.

The electrode paste generated in step S12 is applied in a predetermined shape to the upper face of the first member formed in step S11 by screen printing or any other technique (step S13). In the case where the electrode paste is applied to the first member which is the green body in step S13, the first member may for example be a tape cast. In step S13, other methods different from screen printing may be used to apply the electrode paste. The first member, which is either a green body or a calcined body, may be regarded as a precursor of the first member. Thus, in the case where the electrode paste is applied to the first member that is a green body or a calcined body in step S13, it can be said that the electrode paste is applied to the upper face of the precursor of the first member. Then, the electrode paste is dried for a predetermined amount of time (e.g., one hour) in the atmosphere or other environments, and then the second member is laminated on the first member and the electrode paste to form a laminate (step S14).

Thereafter, the laminate formed in step S14 is fired by hot pressing or any other method so as to integrate the first and second members together and form the main body 21 and the electrode 23 (i.e., the composite sintered body 20) (step S15). Firing conditions (e.g., press pressure, firing temperature, firing time) in step S15 are appropriately determined. The firing temperature (i.e., a maximum temperature during firing) in step S15 may, for example, be higher than or equal to 1550° C. and lower than or equal to 1650° C. Other methods different from hot pressing may be used to fire the laminate in step S15.

Next, Examples 1 to 26 of the composite sintered body 20 (i.e., the main body 21 and the electrode 23) according to the present invention and Comparative Examples 1 to 4 of composite sintered bodies for comparison with the composite sintered body 20 will be described with reference to Tables 1 to 3. The electrodes 23 in Examples 1 to 26 contained Ru, $ZrO_2$, and $Al_2O_3$, whereas the electrodes 23 in Comparative Examples 1 to 4 did not contain $Al_2O_3$.

TABLE 1

| | Main Body | | | | | |
|---|---|---|---|---|---|---|
| | First Member | Second Member | Main | Added Component | | Thermal Expansion Coefficient |
| | (Lower Side) | (Upper Side) | Component | Component | mass % | (ppm/° C.) |
| Comparative Example 1 | Sintered Body | Green Body | $Al_2O_3$ | MgO | 0.025 | 8.1 |
| Comparative Example 2 | Calcined Body | Green Body | $Al_2O_3$ | MgO | 0.025 | 8.1 |
| Comparative Example 3 | Calcined Body | Green Body | $Al_2O_3$ | MgO | 0.025 | 8.1 |
| Comparative Example 4 | Calcined Body | Green Body | $Al_2O_3$ | MgO | 0.025 | 8.1 |
| Example 1 | Calcined Body | Green Body | $Al_2O_3$ | MgO | 0.025 | 8.1 |
| Example 2 | Calcined Body | Green Body | $Al_2O_3$ | MgO | 1.0 | 8.2 |
| Example 3 | Calcined Body | Green Body | $Al_2O_3$ | MgO | 5.0 | 8.3 |
| Example 4 | Calcined Body | Green Body | $Al_2O_3$ | MgO | 0.025 | 8.1 |
| Example 5 | Calcined Body | Green Body | $Al_2O_3$ | MgO | 0.025 | 8.1 |
| Example 6 | Calcined Body | Green Body | $Al_2O_3$ | MgO | 0.025 | 8.1 |
| Example 7 | Calcined Body | Green Body | $Al_2O_3$ | MgO | 0.025 | 8.1 |
| Example 8 | Calcined Body | Green Body | $Al_2O_3$ | MgO | 0.025 | 8.1 |
| Example 9 | Calcined Body | Green Body | $Al_2O_3$ | MgO | 0.025 | 8.1 |
| Example 10 | Calcined Body | Green Body | $Al_2O_3$ | MgO | 0.025 | 8.1 |
| Example 11 | Calcined Body | Green Body | $Al_2O_3$ | MgO | 0.025 | 8.1 |
| Example 12 | Calcined Body | Green Body | $Al_2O_3$ | MgO | 0.025 | 8.1 |
| Example 13 | Calcined Body | Green Body | $Al_2O_3$ | MgO | 0.025 | 8.1 |
| Example 14 | Calcined Body | Calcined Body | $Al_2O_3$ | MgO | 0.025 | 8.1 |
| Example 15 | Calcined Body | Sintered Body | $Al_2O_3$ | MgO | 0.025 | 8.1 |
| Example 16 | Green Body | Green Body | $Al_2O_3$ | MgO | 0.025 | 8.1 |
| Example 17 | Sintered Body | Green Body | $Al_2O_3$ | MgO | 0.025 | 8.1 |
| Example 18 | Sintered Body | Calcined Body | $Al_2O_3$ | MgO | 0.025 | 8.1 |
| Example 19 | Sintered Body | Sintered Body | $Al_2O_3$ | MgO | 0.025 | 8.1 |
| Example 20 | Calcined Body | Green Body | $Al_2O_3$ | MgO | 0.025 | 8.1 |
| Example 21 | Calcined Body | Green Body | $Al_2O_3$ | MgO | 0.025 | 8.1 |
| Example 22 | Calcined Body | Green Body | $Al_2O_3$ | MgO | 0.025 | 8.1 |
| Example 23 | Calcined Body | Green Body | $Al_2O_3$ | MgO | 0.025 | 8.1 |
| Example 24 | Calcined Body | Green Body | $Al_2O_3$ | MgO | 0.025 | 8.1 |
| Example 25 | Calcined Body | Green Body | $Al_2O_3$ | MgO | 0.1 | 8.1 |
| Example 26 | Calcined Body | Green Body | $Al_2O_3$ | MgO | 0.1 | 8.1 |

TABLE 2

| | Electrode | | | | | |
|---|---|---|---|---|---|---|
| | Added Component | | | | | |
| | Ru (volume %) | ZrO$_2$ (volume %) | Al$_2$O$_3$ (volume %) | Total Content of ZrO$_2$ and Al$_2$O$_3$ (volume %) | Ratio of Al$_2$O$_3$ and ZrO$_2$ Contents | Thermal Expansion Coefficient (ppm/° C.) |
| Comparative Example 1 | 100 | — | — | — | — | 7.6 |
| Comparative Example 2 | 90.0 | 10.0 | — | — | — | 7.9 |
| Comparative Example 3 | 82.8 | 17.2 | — | — | — | 8.1 |
| Comparative Example 4 | 72.4 | 27.6 | — | — | — | 8.4 |
| Example 1 | 76.2 | 15.8 | 8.0 | 23.8 | 0.5 | 8.1 |
| Example 2 | 73.0 | 19.0 | 8.0 | 27.0 | 0.4 | 8.2 |
| Example 3 | 69.8 | 22.2 | 8.0 | 30.2 | 0.4 | 8.3 |
| Example 4 | 80.3 | 16.7 | 3.0 | 19.7 | 0.2 | 8.1 |
| Example 5 | 78.7 | 16.3 | 5.0 | 21.3 | 0.3 | 8.1 |
| Example 6 | 76.2 | 15.8 | 8.0 | 23.8 | 0.5 | 8.1 |
| Example 7 | 76.2 | 15.8 | 8.0 | 23.8 | 0.5 | 8.1 |
| Example 8 | 70.4 | 14.6 | 15.0 | 29.6 | 1.0 | 8.1 |
| Example 9 | 36.8 | 13.8 | 50.0 | 63.8 | 3.6 | 8.1 |
| Example 10 | 66.6 | 25.4 | 8.0 | 33.4 | 0.3 | 8.4 |
| Example 11 | 69.8 | 22.2 | 8.0 | 30.2 | 0.4 | 8.3 |
| Example 12 | 82.4 | 9.6 | 8.0 | 17.6 | 0.8 | 7.9 |
| Example 13 | 85.7 | 6.3 | 8.0 | 14.3 | 1.3 | 7.8 |
| Example 14 | 76.2 | 15.8 | 8.0 | 23.8 | 0.5 | 8.1 |
| Example 15 | 76.2 | 15.8 | 8.0 | 23.8 | 0.5 | 8.1 |
| Example 16 | 76.2 | 15.8 | 8.0 | 23.8 | 0.5 | 8.1 |
| Example 17 | 76.2 | 15.8 | 8.0 | 23.8 | 0.5 | 8.1 |
| Example 18 | 76.2 | 15.8 | 8.0 | 23.8 | 0.5 | 8.1 |
| Example 19 | 76.2 | 15.8 | 8.0 | 23.8 | 0.5 | 8.1 |
| Example 20 | 69.9 | 14.3 | 15.8 | 30.1 | 1.1 | 8.1 |
| Example 21 | 63.3 | 13.0 | 23.7 | 36.7 | 1.8 | 8.1 |
| Example 22 | 56.8 | 11.6 | 31.6 | 43.2 | 2.7 | 8.1 |
| Example 23 | 53.5 | 11.0 | 35.6 | 46.6 | 3.2 | 8.1 |
| Example 24 | 50.2 | 10.3 | 39.5 | 49.8 | 3.8 | 8.1 |
| Example 25 | 76.4 | 15.7 | 7.9 | 23.6 | 0.5 | 8.1 |
| Example 26 | 50.1 | 10.3 | 39.5 | 49.8 | 3.8 | 8.1 |

TABLE 3

| | Firing Temperature (° C.) | CTE Difference (ppm/° C.) | RU—ZrO$_2$ Peak Ratio | ZrO$_2$-Occupied Area Ratio | Resistivity of Electrode ×10$^{-5}$ (Ωcm) | Adhesion Intensity of Electrode (Mpa) |
|---|---|---|---|---|---|---|
| Comparative Example 1 | 1600 | 0.5 | — | — | 1.1 | — |
| Comparative Example 2 | 1600 | 0.2 | 0.99 | 0.2 | 1.3 | — |
| Comparative Example 3 | 1600 | 0.0 | 0.95 | 0.2 | 1.5 | — |
| Comparative Example 4 | 1600 | 0.3 | 0.81 | 0.3 | 1.8 | — |
| Example 1 | 1600 | 0.0 | 0.96 | 0.8 | 1.8 | — |
| Example 2 | 1600 | 0.0 | 0.91 | 0.8 | 1.9 | — |
| Example 3 | 1600 | 0.0 | 0.86 | 1.2 | 2.0 | — |
| Example 4 | 1600 | 0.0 | 0.95 | 0.4 | 1.6 | — |
| Example 5 | 1600 | 0.0 | 0.97 | 0.5 | 1.7 | — |
| Example 6 | 1550 | 0.0 | 0.95 | 0.7 | 1.8 | — |
| Example 7 | 1650 | 0.0 | 0.96 | 2.0 | 1.5 | — |
| Example 8 | 1600 | 0.0 | 0.95 | 1.2 | 1.8 | — |
| Example 9 | 1600 | 0.0 | 0.82 | 1.4 | 3.0 | — |
| Example 10 | 1600 | 0.3 | 0.80 | 1.3 | 2.1 | — |
| Example 11 | 1600 | 0.2 | 0.85 | 1.2 | 1.9 | — |
| Example 12 | 1600 | 0.2 | 0.98 | 0.6 | 1.6 | — |
| Example 13 | 1600 | 0.3 | 0.99 | 0.5 | 1.5 | — |
| Example 14 | 1600 | 0.0 | 0.96 | 0.8 | 1.8 | — |
| Example 15 | 1600 | 0.0 | 0.95 | 0.7 | 1.8 | — |

TABLE 3-continued

|  | Firing Temperature (° C.) | CTE Difference (ppm/° C.) | RU—ZrO$_2$ Peak Ratio | ZrO$_2$-Occupied Area Ratio | Resistivity of Electrode ×10$^{-5}$ (Ωcm) | Adhesion Intensity of Electrode (Mpa) |
|---|---|---|---|---|---|---|
| Example 16 | 1600 | 0.0 | 0.95 | 0.9 | 1.9 | — |
| Example 17 | 1600 | 0.0 | 0.97 | 1.0 | 1.7 | — |
| Example 18 | 1600 | 0.0 | 0.97 | 1.1 | 1.7 | — |
| Example 19 | 1600 | 0.0 | 0.96 | 1.0 | 1.8 | — |
| Example 20 | 1600 | 0.0 | 0.98 | 1.5 | 2.0 | Unmeasurable |
| Example 21 | 1600 | 0.0 | 0.96 | 1.6 | 2.2 | Unmeasurable |
| Example 22 | 1600 | 0.0 | 0.83 | 1.0 | 2.7 | 99 |
| Example 23 | 1600 | 0.0 | 0.81 | 0.9 | 2.8 | 121 |
| Example 24 | 1600 | 0.0 | 0.83 | 1.1 | 2.9 | 146 |
| Example 25 | 1600 | 0.0 | 0.92 | 1.8 | 1.9 | 59 |
| Example 26 | 1600 | 0.0 | 0.82 | 1.1 | 2.9 | 250 |

In Examples 1 to 26 and Comparative Examples 1 to 4, the main body 21 and the electrode 23 were produced through steps S11 to S15 described above. In Examples 1 to 26 and Comparative Examples 1 to 4, MgO was used as the additive to Al$_2$O$_3$ in step S11, commercially available high-purity particulate powder of Al$_2$O$_3$ (with 99.99 percent purity or more and an average particle diameter of 0.5 μm) was used as the Al$_2$O$_3$ raw material, and commercially available high-purity particulate powder of MgO (with 99 percent purity or more and an average particle diameter of 1.2 μm) was used as the MgO raw material.

In Examples 1 to 26 and Comparative Examples 1 to 4, the wet mixing of the base powder in step S11 was conducted in a ball mill using an alumina ball and a polyvinyl pot. The mixing time was 20 hours, and an organic solvent was used as the solvent. The slurry generated by the wet mixing was dried and then put through a sieve to obtain the base powder of the main body 21. The green body in step S11 was formed by filling a mold for uniaxial pressure molding with the base powder. The pressure during the uniaxial pressure molding was 100 kgf/cm$^2$. In Examples 1 to 26 and Comparative Examples 1 to 4, the green body was formed into a generally disk-like shape with a diameter of 50 mm and a thickness of 10 mm. In Examples 1 to 26 and Comparative Examples 1 to 4, test specimens smaller than the actual composite sintered body 20 were produced and used.

In Examples 1 to 26 and Comparative Examples 1 to 4, the first and second members used in steps S13 and S14 each were one of a green body, a calcined body, and a sintered body. In the case of using a green body as the first or second member, the green body obtained in step S11 described above was used.

In the case of using a calcined body as the first or second member, in Examples 1 to 26 and Comparative Examples 1 to 4, the calcined body was produced by first producing a green body in the same manner as the green body described above and then subjecting the green body to heat treatment. The firing temperature (i.e., a maximum temperature during the heat treatment) was higher than or equal to 800° C. and lower than or equal to 1000° C. The obtained calcined body was then processed into a generally disk-like shape with a diameter of 50 mm and a thickness of 5 mm. Note that any known method, such as the one in which a green body whose shape is retained by adding a molding agent such as an organic binder to base powder is subjected to heat treatment, may be appropriately employed to produce the calcined body, and conditions for the production are not limited to the conditions described above.

In the case of using a sintered body as the first or second member, a green body was fired by hot pressing. Specifically, the green body described above was housed in a graphite mold for hot pressing and set in a hot press furnace for firing. The press pressure during the firing was 250 kgf/cm$^2$. The firing temperature (i.e., a maximum temperature during the firing) was higher than or equal to 1550° C. and lower than or equal to 1650° C. The firing time was eight hours. The rate of temperature rise and the rate of temperature fall were 300° C./h. The firing atmosphere was a nitrogen gas atmosphere. The obtained sintered body was then processed into a generally disk-like shape with a diameter of 50 mm and a thickness of 5 mm.

In Examples 1 to 26 and Comparative Examples 1 to 4, commercially available high-purity particulate powder of Ru (with 99.9 percent purity or more and an average particle diameter of 15 μm), commercially available high-purity particulate powder of ZrO$_2$ (with 99 percent purity or more and an average particle diameter of 0.4 μm), and commercially available high-purity particulate powder of Al$_2$O$_3$ (with 99.99 percent purity or more and an average particle diameter of 0.5 μm) were used respectively as the Ru raw material, the ZrO$_2$ raw material, and the Al$_2$O$_3$ raw material in step S12.

In Examples 1 to 26 and Comparative Examples 1 to 4, the wet mixing of the base powder in step S12 was conducted in a ball mill using an alumina ball and a polyvinyl pot. The mixing time was 20 hours, and an organic solvent was used as the solvent. The slurry generated by the wet mixing was dried and then put through a sieve to obtain the base powder of the electrode 23. In the generation of the electrode paste, Butyl Sorbitol and poly-n-butyl methacrylate were used as the solvent and the binder to be kneaded with the base powder.

In Examples 1 to 26 and Comparative Examples 1 to 4, the application of the electrode paste in step S13 was implemented by screen printing. The pattern of application of the electrode paste was all-over painting. In Examples 1 to 26 and Comparative Examples 1 to 4, the electrode paste applied to the first member had a generally rectangular shape with a width of 5 mm and a length of 15 mm. The electrode paste had a thickness of 60 μm to 70 μm.

In Examples 1 to 26 and Comparative Examples 1 to 4, the firing in step S15 conducted after the lamination was implemented by hot pressing. Specifically, the laminate described above was housed in a graphite mold for hot pressing and set in a hot press furnace for firing. The press pressure during the firing was 250 kgf/cm$^2$. In Examples 1 to 26 and Comparative Examples 1 to 4, the firing temperature (i.e., a maximum temperature during the firing) was higher than or equal to 1550° C. and lower than or equal to 1650° C. The firing time was in the range of four to eight hours. The rate of temperature rise and the rate of temperature fall were 300° C./h. The firing atmosphere was a nitrogen gas atmosphere.

In Tables 1 to 3, the thermal expansion coefficient of the base material (i.e., the first and second members of the main body 21) was measured at temperatures within a range of 40° C. to 1000° C. by a method compliant with JIS-R1618, using a sintered-body sample cut from the main body 21. The thermal expansion coefficient of the electrode 23 was obtained based on the thermal expansion coefficient of each of the simple substances Ru, $ZrO_2$, and $Al_2O_3$ and the Ru, $ZrO_2$, and $Al_2O_3$ contents in the electrode 23. Specifically, the thermal expansion coefficient of the electrode 23 was assumed to be a total of the product of the thermal expansion coefficient of the simple substance Ru and the Ru content (% by volume) in the electrode 23, the product of the thermal expansion coefficient of the simple substance $ZrO_2$ and the $ZrO_2$ content (% by volume) in the electrode 23, and the product of the thermal expansion coefficient of the simple substance $Al_2O_3$ and the $Al_2O_3$ content (% by volume) in the electrode 23. The thermal expansion coefficient of each of the simple substances Ru, $ZrO_2$, and $Al_2O_3$ was measured at temperatures within a range of 40° C. to 1000° C. by a method compliant with JIS-R1618, using a bulk material produced by subjecting the commercially available Ru powder, the commercially available ZrO2 powder, and the commercially available $Al_2O_3$ powder used in step S12 to hot pressing firing under conditions similar to the conditions in step S11. The CTE difference was an absolute value for the difference in thermal expansion coefficient between the electrode 23 and the main body 21 described above.

The Ru—$ZrO_2$ peak ratio in the electrode 23 was the aforementioned ratio between the main peak intensity of Ru and the main peak intensity of $ZrO_2$ measured by XRD described above. The Ru—$ZrO_2$ peak ratio was calculated from $I1/(I1+I2)$, where I1 is the intensity on the (101) plane, i.e., the main peaks of Ru, and I2 is the intensity on the (111) plane, i.e., the main peaks of $ZrO_2$. The measurement by XRD was conducted under the condition in which the second member was removed to expose the electrode 23 located on the first member. A sealed-in-tube X-ray diffraction instrument (D8-ADVANCE manufactured by Bruker AXS Inc.) was used as an X-ray diffraction instrument. Measurement conditions were CuKα, 40 kV, 40 mA, 2θ of 10 to 70°, and a step width of 0.002°.

A $ZrO_2$-occupied area ratio was a parameter indicating the degree of uneven distribution of $ZrO_2$ in the electrode 23 and obtained as follows. First, a test specimen having a section generally parallel to the up-down direction (i.e., the thickness direction of the electrode 23) was cut from the composite sintered body 20 formed in step S15. The test specimen was cut out such that the electrode 23 was located in a generally central portion in the up-down direction. Then, the aforementioned section of the test specimen was mirror polished, and an image of this section (i.e., sectional SEM image) was acquired with a scanning electron microscope (SEM).

Figure 3:
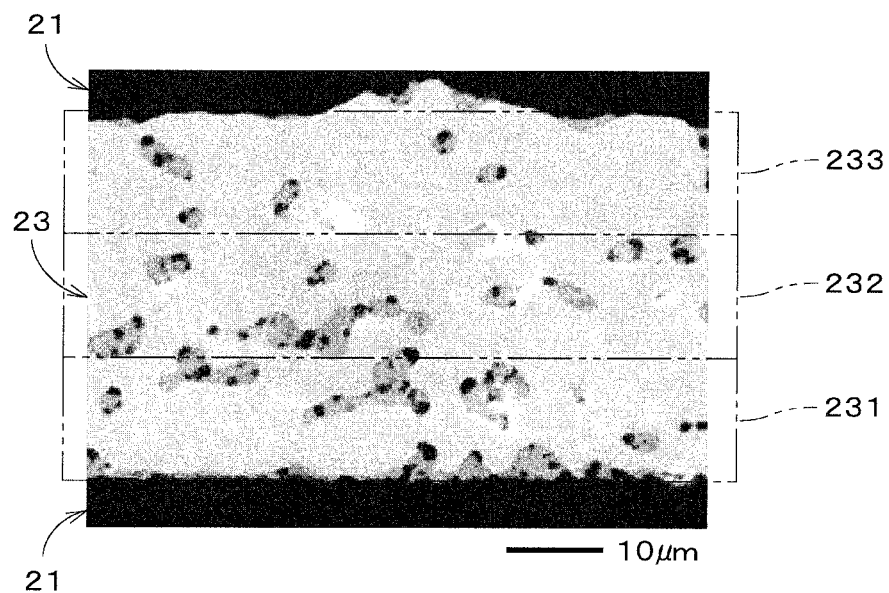
FIG. 3 is an illustration of a sectional SEM image of a composite sintered body according to one example.

FIG. 3 is an illustration of the sectional SEM image of the composite sintered body 20 in Example 1. A whitish region in the central portion in the up-down direction in FIG. 3 corresponds to the electrode 23. A black band-like region on the lower side of the electrode 23 corresponds to the first member of the main body 21, and a black band-like region on the upper side of the electrode 23 corresponds to the second member of the main body 21. In the region corresponding to the electrode 23, a largest thin-color region serving as a background corresponds to Ru, and a gray island region darker than the region of Ru corresponds to $ZrO_2$. The same applies to FIG. 5, which will be described later. In the region corresponding to the electrode 23 in FIG. 3, black point-like regions that are located on almost the region of $ZrO_2$ and darker than the region of $ZrO_2$ correspond to $Al_2O_3$.

Next, the region corresponding to the electrode 23 in the sectional SEM image (i.e., the sectional SEM image of the electrode 23) was divided into three pieces in the up-down direction to set three generally rectangular regions arranged in the up-down direction. In the following description, these three regions are referred to as a "first region 231," a "second region 232," and a "third region 233" in order from the lower side (i.e., on the first member side), which is one side in the up-down direction. In FIG. 3, the first region 231, the second region 232, and the third region 233 are each encircled and indicated by a chain double-dashed line. Thereafter, the area occupied by $ZrO_2$ in the first region 231 and the area occupied by $ZrO_2$ in the second region 232 were calculated using image processing software ("Image-Pro" manufactured by Hakuto Co., Ltd.). Then, the area occupied by $ZrO_2$ in the second region 232 was divided by the area occupied by $ZrO_2$ in the first region 231 to obtain the $ZrO_2$-occupied area ratio.

As the $ZrO_2$-occupied area ratio approached 1.0, a difference in $ZrO_2$ occupancy rate between the first region 231 and the second region 232 decreased. That is, as the $ZrO_2$-occupied area ratio approached 1.0, $ZrO_2$ approached a state in which $ZrO_2$ was distributed more evenly in the first region 231 and the second region 232. As the $ZrO_2$-occupied area ratio decreased within a range less than or equal to 1.0, the $ZrO_2$ occupancy rate in the first region 231 became higher than the $ZrO_2$ occupancy rate in the second region 232. That is, as the $ZrO_2$-occupied area ratio decreased within a range less than or equal to 1.0, the degree of uneven distribution of $ZrO_2$ in the first region 231 (i.e., in the region on the first member side) increased gradually as compared with the degree thereof in the second region 232 (i.e., in the central region of the electrode 3 in the thickness direction).

The resistivity of the electrode 23 was obtained as follows. First, a test specimen of a generally rectangular parallelepiped shape with a width of 9 mm, a length of 9 mm, and a thickness of 9 mm was cut from the composite sintered body 20 formed in step S15. The test specimen was cut out such that the electrode 23 with a width of 5 mm and a length of 9 mm was formed inside the central portion. The electrode 23 with a width of 5 mm was exposed on opposite end faces of the test specimen. A cross-sectional area S ($cm^2$) of the electrode 23 was obtained by measuring the width and length of the electrode 23 on the end faces of the test specimen with an optical microscope. The distance between the opposite end faces of the test specimen that exposed the electrode 23 was measured with a caliper and assumed to be the length L (cm) of the electrode 23. A circuit for measuring the resistivity was configured by applying a conductive paste to the opposite end faces of the electrode 23 and connecting leads thereto. Then, a small current I (mA) within a range of 0 mA to 150 mA was applied to the electrode 23 at the room temperature in the atmosphere to measure the value for a small voltage V (mV) generated at that time and obtain resistance R ($\Omega$) of the electrode 23 from $R=V/I$. Thereafter, the resistivity ρ ($\Omega \cdot cm$) of the electrode 23 was obtained from $\rho=R \times S/L$.

The adhesion strength of the electrode 23 was obtained as follows. First, a test specimen of a generally circular columnar shape extending in the up-down direction (i.e., the thickness direction of the composite sintered body 20) was cut from the composite sintered body 20 formed in step S15. The composite sintered body 20 from which the test specimen for measuring the adhesion strength was cut was different in thickness and the pattern of application of the electrode paste from the one used for the other measurements described above. Specifically, the electrode paste was applied to the first member of a generally disk-like shape with a diameter of 50 mm and a thickness of 10 mm in a generally circular shape slightly smaller in diameter than the first member. The electrode paste had a thickness of 50 μm to 60 μm. Then, the second member of a generally disk-like shape with a diameter of 50 mm and a thickness of 10 mm was laminated on the first member and on the electrode paste so as to form a laminate of a generally disk-like shape with a diameter of 50 mm and a thickness 20 mm. Thereafter, the laminate was fired at a temperature of 1600° C. to 1700° C. to form the composite sintered body 20.

Five test specimens were cut from the composite sintered body 20. The positions from which the test specimens were cut from the composite sintered body 20 (i.e., the position of the center of each test specimen in plan view) include the center of the composite sintered body 20 in plan view and four positions arranged at equiangular intervals in a peripheral direction on the circumference of the same circle around the center. Sections of these test specimens perpendicular to the longitudinal direction (i.e., the up-down direction) had a diameter of 9.9 mm. These test specimens each included the electrode 23 of a generally disk-like shape in an approximately central portion in the longitudinal direction, and upper and lower portions of the electrode 23 corresponded respectively to first and second portions of the main body 21. In the test specimens, the electrode 23 was provided on approximately the entire upper end face of the first portion and on approximately the entire lower end face of the second portion.

Figure 4:
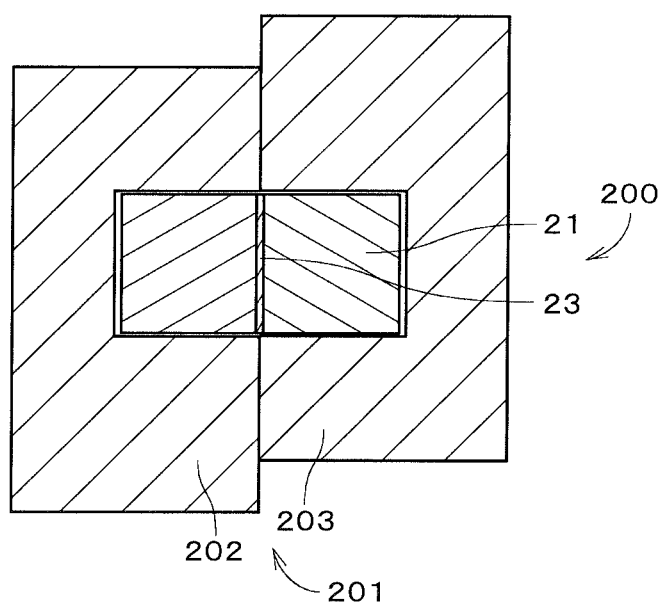
FIG. 4 is a sectional view illustrating a test specimen and a jig in the process of obtaining adhesion strength of an electrode.

Then, a test specimen 200 arranged to make the longitudinal direction horizontal was housed inside a jig 201 as illustrated in FIG. 4. The inside of the jig 201 had a storage space of approximately the same shape as the shape of the test specimen 200. The jig 201 included two jig elements 202 and 203 adjacent to each other in the right-left direction. A portion of the test specimen 200 on the left side of the electrode 23 was housed in the jig element 202, and a portion of the test specimen 200 on the right side of the electrode 23 was housed in the jig element 203. The interface between the jig elements 202 and 203 that were in surface contact in the right-left direction was located at the same position in the right-left direction as the electrode 23 of the test specimen 200. The lower face of the jig element 202 protrudes below the lower face of the jig element 203, and the upper face of the jig element 203 protrudes above the upper face of the jig element 202.

The jig 201 with the test specimen 200 housed therein was set to be sandwiched from above and below with "AUTOGRAPH AG-10TD" manufactured by Shimadzu Corporation. Then, upward and downward loads were applied respectively to the jig elements 202 and 203. That is, a shear load was applied to the electrode 23. Then, the loads were increased gradually, and the test was conducted until a rupture of the right and left portions of the electrode 23 of the test specimen 200 (i.e., the first and second portions of the main body 21). Thereafter, a measured maximum load was divided by the area of the electrode 23 perpendicular to the longitudinal direction (i.e., a cross-sectional area of the test specimen 200 perpendicular to the longitudinal direction) to obtain the adhesion strength of the electrode 23.

In Examples 1 to 26 and Comparative Examples 1 to 4, the main component for the main body 21 was $Al_2O_3$, and the additive was MgO. In Examples 1 to 26, the electrode 23 was formed of Ru, $ZrO_2$, and $Al_2O_3$ as described above. On the other hand, in Comparative Example 1, the electrode 23 was formed of only Ru and did not contain $ZrO_2$ and $Al_2O_3$. In Comparative Examples 2 to 4, the electrode 23 was formed of Ru and $ZrO_2$ and did not contain $Al_2O_3$.

In Example 1, a calcined body was used as the first member of the main body 21 to which the electrode paste was applied in step S13. Also, a green body was used as the second member to be laminated on the first member in step S14. The MgO content in the main body 21 was 0.025% by mass, and the main body 21 had a thermal expansion coefficient of 8.1 ppm/° C. The reaming portion of the main body 21 other than MgO was $Al_2O_3$ (the same applies to the other examples and comparative examples). A total content of $ZrO_2$ and $Al_2O_3$ in the electrode 23 was 23.8% by volume, and the $Al_2O_3/ZrO_2$ content ratio was 0.5. The electrode 23 had a thermal expansion coefficient of 8.1 ppm/° C. The firing temperature (i.e., a maximum temperature during the firing) of the composite sintered body 20 was 1600° C.

In Example 1, the CTE difference (i.e., the absolute value for the difference in thermal expansion coefficient between the electrode 23 and the main body 21 at temperatures within a range higher than or equal to 40° C. and lower than or equal to 1000° C.) was 0.0 ppm/° C. The Ru—$ZrO_2$ peak ratio was 0.96. The $ZrO_2$-occupied area ratio was 0.8. The resistivity of the electrode 23 was $1.8 \times 10^{-5}$ Ω·cm.

It has been found from Example 1 that the $ZrO_2$-occupied area ratio close to 1.0 suppressed the occurrence of uneven distribution of $ZrO_2$ toward the first member (i.e., on the lower side) in the electrode paste when the electrode paste applied to the first member was drawn in the first member by suction and also suppressed the occurrence of uneven distribution of $ZrO_2$ toward the first member in the fired electrode 23. Besides, since the CTE difference was less than or equal to 0.3 ppm/° C. and small and an uneven distribution of $ZrO_2$ was also suppressed as described above, neither cracks in the main body 21 nor delamination of the electrode 23 occurred due to the difference in thermal expansion coefficient between the main body 21 and the electrode 23. Besides, the resistivity of the electrode 23 was less than or equal to $3.0 \times 10^{-5}$ Ω·cm and low.

In Example 2, the MgO content in the main body 21 was 1.0% by mass, and the main body 21 had a thermal expansion coefficient of 8.2 ppm/° C. A total content of $ZrO_2$ and $Al_2O_3$ in the electrode 23 was 27.0% by volume, and the $Al_2O_3/ZrO_2$ content ratio was 0.4. The electrode 23 had a thermal expansion coefficient of 8.2 ppm/° C. The other conditions are the same as the conditions in Example 1.

In Example 2, the CTE difference was 0.0 ppm/° C. The Ru—$ZrO_2$ peak ratio was 0.91. The $ZrO_2$-occupied area ratio was 0.8. The resistivity of the electrode 23 was $1.9 \times 10^{-5}$ Ω·cm. Since the CTE difference was small and an uneven distribution of $ZrO_2$ was suppressed in Example 2, neither cracks in the main body 21 nor delamination of the electrode 23 occurred due to the difference in thermal expansion coefficient between the main body 21 and the electrode 23. Besides, the resistivity of the electrode 23 was low.

In Example 3, the MgO content in the main body 21 was 5.0% by mass, and the main body 21 had a thermal expansion coefficient of 8.3 ppm/° C. A total content of $ZrO_2$ and $Al_2O_3$ in the electrode 23 was 30.2% by volume, and the Al₂O₃/ZrO₂ content ratio was 0.4. The electrode 23 had a thermal expansion coefficient of 8.3 ppm/° C. The other conditions were the same as the conditions in Example 1.

In Example 3, the CTE difference was 0.0 ppm/° C. The Ru—$ZrO_2$ peak ratio was 0.86. The $ZrO_2$-occupied area ratio was 1.2. The resistivity of the electrode 23 was $2.0 \times 10^{-5}$ Ω·cm. Since the CTE difference was small and an uneven distribution of $ZrO_2$ was suppressed in Example 3, neither cracks in the main body 21 nor delamination of the electrode 23 occurred due to the difference in thermal expansion coefficient between the main body 21 and the electrode 23. Besides, the resistivity of the electrode 23 was low.

Focusing now on Examples 1 to 3, even if the thermal expansion coefficient of the main body 21 varied within the above-described range (i.e., the range of 8.1 ppm/° C. to 8.3 ppm/° C.), it was possible to make the CTE difference equal to 0.0 ppm/° C., to make the $ZrO_2$-occupied area ratio fall in the range of 0.8 to 1.2, and to prevent cracks in the main body 21 and delamination of the electrode 23.

In Example 4, the total content of $ZrO_2$ and $Al_2O_3$ in the electrode 23 was 19.7% by volume, and the $Al_2O_3/ZrO_2$ content ratio was 0.2. The other conditions were the same as the conditions in Example 1.

In Example 4, the CTE difference was 0.0 ppm/° C. The Ru—$ZrO_2$ peak ratio was 0.95. The $ZrO_2$-occupied area ratio was 0.4. The resistivity of the electrode 23 was $1.6 \times 10^{-5}$ Ω·cm. Since the CTE difference was small and an uneven distribution of $ZrO_2$ was relatively suppressed in Example 4, neither cracks in the main body 21 nor delamination of the electrode 23 occurred due to the difference in thermal expansion coefficient between the main body 21 and the electrode 23. Besides, the resistivity of the electrode 23 was low.

In Example 5, the total content of $ZrO_2$ and $Al_2O_3$ in the electrode 23 was 21.3% by volume, and the $Al_2O_3/ZrO_2$ content ratio was 0.3. The other conditions were the same as the conditions in Example 1.

In Example 5, the CTE difference was 0.0 ppm/° C. The Ru—$ZrO_2$ peak ratio was 0.97. The $ZrO_2$-occupied area ratio was 0.5. The resistivity of the electrode 23 was $1.7 \times 10^{-5}$ Ω·cm. Since the CTE difference was small and an uneven distribution of $ZrO_2$ was suppressed in Example 5, neither cracks in the main body 21 nor delamination of the electrode 23 occurred due to the difference in thermal expansion coefficient between the main body 21 and the electrode 23. Besides, the resistivity of the electrode 23 was low.

In Example 6, the firing temperature of the composite sintered body 20 was 1550° C. The other conditions were the same as the conditions in Example 1.

In Example 6, the CTE difference was 0.0 ppm/° C. The Ru—$ZrO_2$ peak ratio was 0.95. The $ZrO_2$-occupied area ratio was 0.7. The resistivity of the electrode 23 was $1.8 \times 10^{-5}$ Ω·cm. Since the CTE difference was small and an uneven distribution of $ZrO_2$ was suppressed in Example 6, neither cracks in the main body 21 nor delamination of the electrode 23 occurred due to the difference in thermal expansion coefficient between the main body 21 and the electrode 23. Besides, the resistivity of the electrode 23 was low.

In Example 7, the firing temperature of the composite sintered body 20 was 1650° C. The other conditions were the same as the conditions in Example 1.

In Example 7, the CTE difference was 0.0 ppm/° C. The Ru—$ZrO_2$ peak ratio was 0.96. The $ZrO_2$-occupied area ratio was 2.0. The resistivity of the electrode 23 was $1.5 \times 10^{-5}$ Ω·cm. Since the CTE difference was small and an uneven distribution of $ZrO_2$ was suppressed in Example 7, neither cracks in the main body 21 nor delamination of the electrode 23 occurred due to the difference in thermal expansion coefficient between the main body 21 and the electrode 23. Besides, the resistivity of the electrode 23 was low.

Focusing now on Examples 1, 6, and 7, even if the firing temperature of the composite sintered body 20 varied within the above-described range (i.e., the range of 1550° C. to 1650° C.), it was possible to make the CTE difference equal to 0.0 ppm/° C., make the $ZrO_2$-occupied area ratio fall in the range of 0.7 to 2.0, and to prevent cracks in the main body 21 and delamination of the electrode 23.

In Example 8, the total content of $ZrO_2$ and $Al_2O_3$ in the electrode 23 was 29.6% by volume, and the $Al_2O_3/ZrO_2$ content ratio was 1.0. The other conditions were the same as the conditions in Example 1.

In Example 8, the CTE difference was 0.0 ppm/° C. The Ru—$ZrO_2$ peak ratio was 0.95. The $ZrO_2$-occupied area ratio was 1.2. The resistivity of the electrode 23 was $1.8 \times 10^{-5}$ Ω·cm. Since the CTE difference was small and an uneven distribution of $ZrO_2$ was suppressed in Example 8, neither cracks in the main body 21 nor delamination of the electrode 23 occurred due to the difference in thermal expansion coefficient between the main body 21 and the electrode 23. Besides, the resistivity of the electrode 23 was low.

In Example 9, the total content of $ZrO_2$ and $Al_2O_3$ in the electrode 23 was 63.8% by volume, and the $Al_2O_3/ZrO_2$ content ratio was 3.6. The other conditions were the same as the conditions in Example 1.

In Example 9, the CTE difference was 0.0 ppm/° C. The Ru—$ZrO_2$ peak ratio was 0.82. The $ZrO_2$-occupied area ratio was 1.4. The resistivity of the electrode 23 was $3.0 \times 10^{-5}$ Ω·cm. Since the CTE difference was small and an uneven distribution of $ZrO_2$ was relatively suppressed in Example 9, neither cracks in the main body 21 nor delamination of the electrode 23 occurred due to the difference in thermal expansion coefficient between the main body 21 and the electrode 23. Besides, the resistivity of the electrode 23 was low.

Focusing now on Examples 1, 4, 5, 8, and 9, even if the total content of $ZrO_2$ and $Al_2O_3$ in the electrode 23 varied within the above-described range (i.e., the range of 19.7% by volume to 63.8% by volume) and the $Al_2O_3/ZrO_2$ content ratio varied within the above-described range (i.e., the range of 0.2 to 3.6), it was possible to make the CTE difference equal to 0.0 ppm/° C., make the $ZrO_2$-occupied area ratio fall in the range of 0.4 to 1.4, and to prevent cracks in the main body 21 and delamination of the electrode 23.

In Examples 1, 5, 8, and 9, the total content of $ZrO_2$ and $Al_2O_3$ in the electrode 23 was in the range of 21.3% by volume to 63.8% by volume (i.e., higher than or equal to 20% by volume), whereas in Example 4, the total content was 19.7% by volume (i.e., less than 20% by volume). Thus, in Examples 1, 5, 8, and 9, the $ZrO_2$-occupied area ratio was in the range of 0.5 to 1.4 (i.e., higher than or equal to 0.5 and lower than or equal to 2.0), whereas in Example 4, the $ZrO_2$-occupied area ratio was 0.4 (i.e., less than 0.5). In Examples 1, 5, 8, and 9, an uneven distribution of $ZrO_2$ in the electrode 23 was more favorably suppressed than in Example 4.

In Example 10, the total content of $ZrO_2$ and $Al_2O_3$ in the electrode 23 was 33.4% by volume, and the $Al_2O_3/ZrO_2$ content ratio was 0.3. The electrode 23 had a thermal expansion coefficient of 8.4 ppm/° C. The other conditions were the same as the conditions in Example 1.

In Example 10, the CTE difference was 0.3 ppm/° C. The Ru—$ZrO_2$ peak ratio was 0.80. The $ZrO_2$-occupied area ratio was 1.3. The resistivity of the electrode 23 was $2.1 \times 10^{-5}$ Ω·cm. Since the CTE difference was small and an uneven distribution of $ZrO_2$ was suppressed in Example 10, neither cracks in the main body 21 nor delamination of the electrode 23 occurred due to the difference in thermal expansion coefficient between the main body 21 and the electrode 23. Besides, the resistivity of the electrode 23 was low.

In Example 11, the total content of $ZrO_2$ and $Al_2O_3$ in the electrode 23 was 30.2% by volume, and the $Al_2O_3/ZrO_2$ content ratio was 0.4. The electrode 23 had a thermal expansion coefficient of 8.3 ppm/° C. The other conditions were the same as the conditions in Example 1.

In Example 11, the CTE difference was 0.2 ppm/° C. The Ru—$ZrO_2$ peak ratio was 0.85. The $ZrO_2$-occupied area ratio was 1.2. The resistivity of the electrode 23 was $1.9 \times 10^{-5}$ Ω·cm m. Since the CTE difference was small and an uneven distribution of $ZrO_2$ was suppressed in Example 11, neither cracks in the main body 21 nor delamination of the electrode 23 occurred due to the difference in thermal expansion coefficient between the main body 21 and the electrode 23. Besides, the resistivity of the electrode 23 was low.

In Example 12, the total content of $ZrO_2$ and $Al_2O_3$ in the electrode 23 was 17.6% by volume, and the $Al_2O_3/ZrO_2$ content ratio was 0.8. The electrode 23 had a thermal expansion coefficient of 7.9 ppm/° C. The other conditions were the same as the conditions in Example 1.

In Example 12, the CTE difference was 0.2 ppm/° C. The Ru—$ZrO_2$ peak ratio was 0.98. The $ZrO_2$-occupied area ratio was 0.6. The resistivity of the electrode 23 was $1.6 \times 10^{-5}$ Ω·cm. Since the CTE difference was small and an uneven distribution of $ZrO_2$ was suppressed in Example 12, neither cracks in the main body 21 nor delamination of the electrode 23 occurred due to the difference in thermal expansion coefficient between the main body 21 and the electrode 23. Besides, the resistivity of the electrode 23 was low.

In Example 13, the total content of $ZrO_2$ and $Al_2O_3$ in the electrode 23 was 14.3% by volume, and the $Al_2O_3/ZrO_2$ content ratio was 1.3. The electrode 23 had a thermal expansion coefficient of 7.8 ppm/° C. The other conditions were the same as the conditions in Example 1.

In Example 13, the CTE difference was 0.3 ppm/° C. The Ru—$ZrO_2$ peak ratio was 0.99. The $ZrO_2$-occupied area ratio was 0.5. The resistivity of the electrode 23 was $1.5 \times 10^{-5}$ Ω·cm. Since the CTE difference was small and an uneven distribution of $ZrO_2$ was suppressed in Example 13, neither cracks in the main body 21 nor delamination of the electrode 23 occurred due to the difference in thermal expansion coefficient between the main body 21 and the electrode 23. Besides, the resistivity of the electrode 23 was low.

Focusing now on Example 1 and 10 to 13, even if the total content of $ZrO_2$ and $Al_2O_3$ in the electrode 23 and the $Al_2O_3/ZrO_2$ content ratio in the electrode 23 varied and the CTE difference varied within the above-described range (i.e., the range of 0.0 ppm/° C. to 0.3 ppm/° C.), it was possible to make the $ZrO_2$-occupied area ratio fall in the range of 0.5 to 1.3 and to prevent cracks in the main body 21 and delamination of the electrode 23.

In Example 14, the second member laminated on the first member in step S14 was a calcined body. The other conditions were the same as the conditions in Example 1.

In Example 14, the CTE difference was 0.0 ppm/° C. The Ru—$ZrO_2$ peak ratio was 0.96. The $ZrO_2$-occupied area ratio was 0.8. The resistivity of the electrode 23 was $1.8 \times 10^{-5}$ Ω·cm. These numeric values in Example 14 were the same as the numeric values in Example 1. Thus, in Example 14, neither cracks in the main body 21 nor delamination of the electrode 23 occurred due to the difference in thermal expansion coefficient between the main body 21 and the electrode 23. Besides, the resistivity of the electrode 23 was low.

In Example 15, the second member laminated on the first member in step S14 was a sintered body. The other conditions were the same as the conditions in Example 1.

In Example 15, the CTE difference was 0.0 ppm/° C. The Ru—$ZrO_2$ peak ratio was 0.95. The $ZrO_2$-occupied area ratio was 0.7. The resistivity of the electrode 23 was $1.8 \times 10^{-5}$ Ω·cm. These numeric values in Example 15 were almost the same as the numeric values in Example 1. Thus, in Example 15, neither cracks in the main body 21 nor delamination of the electrode 23 occurred due to the difference in thermal expansion coefficient between the main body 21 and the electrode 23. Besides, the resistivity of the electrode 23 was low.

Focusing now on Examples 1, 14, and 15, even if the second member laminated on the first member in step S14 was any of the green body, the calcined body, and the sintered body, it was possible to make the CTE difference equal to 0.0 ppm/° C., make the $ZrO_2$-occupied area ratio fall in the range of 0.7 to 0.8, and to prevent cracks in the main body 21 and delamination of the electrode 23.

In Example 16, the first member to which the electrode paste was applied in step S13 was a tape cast. The other conditions were the same as the conditions in Example 1.

In Example 16, the CTE difference was 0.0 ppm/° C. The Ru—$Zr_{O2}$ peak ratio was 0.95. The $ZrO_2$-occupied area ratio was 0.9. The resistivity of the electrode 23 was $1.9 \times 10^{-5}$ Ω·cm. Since the CTE difference was small and an uneven distribution of $ZrO_2$ was suppressed in Example 16, neither cracks in the main body 21 nor delamination of the electrode 23 occurred due to the difference in thermal expansion coefficient between the main body 21 and the electrode 23. Besides, the resistivity of the electrode 23 was low.

In Example 17, the first member to which the electrode paste was applied in step S13 was a sintered body. The other conditions were the same as the conditions in Example 1.

In Example 17, the CTE difference was 0.0 ppm/° C. The Ru—$ZrO_2$ peak ratio was 0.97. The $ZrO_2$-occupied area ratio was 1.0. The resistivity of the electrode 23 was $1.7 \times 10^{-5}$ Ω·cm. Since the CTE difference was small and an uneven distribution of $ZrO_2$ was suppressed in Example 17, neither cracks in the main body 21 nor delamination of the electrode 23 occurred due to the difference in thermal expansion coefficient between the main body 21 and the electrode 23. Besides, the resistivity of the electrode 23 was low.

Focusing now on Examples 1, 16, and 17, even if the first member to which the electrode paste was applied in step S13 was any of the calcined body, the green body, and the sintered body, it was possible to make the CTE difference equal to 0.0 ppm/° C., make the $ZrO_2$-occupied area ratio fall in the range of 0.8 to 1.0, and to prevent cracks in the main body 21 and delamination of the electrode 23.

In Example 18, the second member laminated on the first member in step S14 was a calcined body. The other conditions were the same as the conditions in Example 17.

In Example 18, the CTE difference was 0.0 ppm/° C. The Ru—$ZrO_2$ peak ratio was 0.97. The $ZrO_2$-occupied area ratio was 1.1. The resistivity of the electrode 23 was $1.7 \times 10^{-5}$ Ω·cm. These numeric values in Example 18 were almost the same as the numeric values in Example 17. Thus, in Example 18, neither cracks in the main body 21 nor delamination of the electrode 23 occurred due to the difference in thermal expansion coefficient between the main body 21 and the electrode 23. Besides, the resistivity of the electrode 23 was low.

In Example 19, the second member laminated on the first member in step S14 was a sintered body. The other conditions were the same as the conditions in Example 17.

In Example 19, the CTE difference was 0.0 ppm/° C. The Ru—$ZrO_2$ peak ratio was 0.96. The $ZrO_2$-occupied area ratio was 1.0. The resistivity of the electrode 23 was $1.8 \times 10^{-5}$ Ω·cm. These numeric values in Example 19 were almost the same as the numeric values in Example 17. Thus, in Example 19, neither cracks in the main body 21 nor delamination of the electrode 23 occurred due to the difference in thermal expansion coefficient between the main body 21 and the electrode 23. Besides, the resistivity of the electrode 23 was low.

Focusing now on Examples 17 to 19, even if the second member laminated on the first member in step S14 was any of the green body, the calcined body, and the sintered body, it was possible to make the CTE difference equal to 0.0 ppm/° C., make the $ZrO_2$-occupied area ratio fall in the range of 1.0 to 1.1, and to prevent cracks in the main body 21 and delamination of the electrode 23.

In Example 20, the total content of $ZrO_2$ and $Al_2O_3$ in the electrode 23 was 30.1% by volume, and the $Al_2O_3/ZrO_2$ content ratio was 1.1. The other conditions were the same as the conditions in Example 1.

In Example 20, the CTE difference was 0.0 ppm/° C. The Ru—$ZrO_2$ peak ratio was 0.98. The $ZrO_2$-occupied area ratio was 1.5. The resistivity of the electrode 23 was $2.0 \times 10^{-5}$ Ω·cm. Since the CTE difference was small and an uneven distribution of $ZrO_2$ was relatively suppressed in Example 20, neither cracks in the main body 21 nor delamination of the electrode 23 occurred due to the difference in thermal expansion coefficient between the main body 21 and the electrode 23. Besides, the resistivity of the electrode 23 was low. Note that in Example 20, test specimens 200 (see FIG. 4) for measuring the adhesion strength of the electrode 23 were cut out, but measurements could not be conducted because the first and second portions were separated from each other in the course of cutout.

In Example 21, the total content of $ZrO_2$ and $Al_2O_3$ in the electrode 23 was 36.7% by volume, and the $Al_2O_3/ZrO_2$ content ratio was 1.8. The other conditions were the same as the conditions in Example 20.

In Example 21, the CTE difference was 0.0 ppm/° C. The Ru—$ZrO_2$ peak ratio was 0.96. The $ZrO_2$-occupied area ratio was 1.6. The resistivity of the electrode 23 was $2.2 \times 10^{-5}$ Ω·cm. Since the CTE difference was small and an uneven distribution of $ZrO_2$ was relatively suppressed in Example 21, neither cracks in the main body 21 nor delamination of the electrode 23 occurred due to the difference in thermal expansion coefficient between the main body 21 and the electrode 23. Besides, the resistivity of the electrode 23 was low. In Example 21, the adhesion strength of the electrode 23 could not be measured as in Example 20 because the first and second portions were separated from each other in the course of cutout.

In Example 22, the total content of $ZrO_2$ and $Al_2O_3$ in the electrode 23 was 43.2% by volume, and the $Al_2O_3/ZrO_2$ content ratio was 2.7. The other conditions were the same as the conditions in Example 20.

In Example 22, the CTE difference was 0.0 ppm/° C. The Ru—$ZrO_2$ peak ratio was 0.83. The $ZrO_2$-occupied area ratio was 1.0. The resistivity of the electrode 23 was $2.7 \times 10^{-5}$ Ω·cm. Since the CTE difference was small and an uneven distribution of $ZrO_2$ was relatively suppressed in Example 22, neither cracks in the main body 21 nor delamination of the electrode 23 occurred due to the difference in thermal expansion coefficient between the main body 21 and the electrode 23. Besides, the resistivity of the electrode 23 was low. The electrode 23 had an adhesion strength of 99 MPa. Since the adhesion strength was higher than or equal to 90 MPa and relatively high in Example 22, it was possible to favorably suppress delamination of the electrode 23 from the main body 21 due to factors such as a mechanical shock.

In Example 23, the total content of $ZrO_2$ and $Al_2O_3$ in the electrode 23 was 46.6% by volume, and the $Al_2O_3/ZrO_2$ content ratio was 3.2. The other conditions were the same as the conditions in Example 20.

In Example 23, the CTE difference was 0.0 ppm/° C. The Ru—$ZrO_2$ peak ratio was 0.81. The $ZrO_2$-occupied area ratio was 0.9. The resistivity of the electrode 23 was $2.8 \times 10^{-5}$ Ω·cm. Since the CTE difference was small and an uneven distribution of $ZrO_2$ was relatively suppressed in Example 23, neither cracks in the main body 21 nor delamination of the electrode 23 occurred due to the difference in thermal expansion coefficient between the main body 21 and the electrode 23. Besides, the resistivity of the electrode 23 was low. Moreover, the electrode 23 had an adhesion strength of 121 MPa. Since the adhesion strength was higher than or equal to 90 MPa and relatively high in Example 23, it was possible to favorably suppress delamination of the electrode 23 from the main body 21 due to factors such as a mechanical shock.

In Example 24, the total content of $ZrO_2$ and $Al_2O_3$ in the electrode 23 was 49.8% by volume, and the $Al_2O_3/ZrO_2$ content ratio was 3.8. The other conditions were the same as the conditions in Example 20.

In Example 24, the CTE difference was 0.0 ppm/° C. The Ru—$ZrO_2$ peak ratio was 0.83. The $ZrO_2$-occupied area ratio was 1.1. The resistivity of the electrode 23 was $2.9 \times 10^{-5}$ Ω·cm. Since the CTE difference was small and an uneven distribution of $ZrO_2$ was relatively suppressed in Example 24, neither cracks in the main body 21 nor delamination of the electrode 23 occurred due to the difference in thermal expansion coefficient between the main body 21 and the electrode 23. Besides, the resistivity of the electrode 23 was low. The electrode 23 had an adhesion strength of 146 MPa. Since the adhesion strength was higher than or equal to 90 MPa and relatively high in Example 24, it was possible to favorably suppress delamination of the electrode 23 from the main body 21 due to factors such as a mechanical shock.

Focusing now on Examples 20 to 24, from the viewpoint of increasing the adhesion strength of the electrode 23, the total content of $ZrO_2$ and $Al_2O_3$ in the electrode 23 was preferably higher than or equal to 40% by volume. The $Al_2O_3/ZrO_2$ content ratio was preferably higher than or equal to 2.0.

Focusing now on Examples 20 to 23, even if the total content of $ZrO_2$ and $Al_2O_3$ in the electrode 23 varied within the above-described range (i.e., the range of 30.1% by volume to 46.6% by volume) and the $Al_2O_3/ZrO_2$ content ratio varied within the above-described range (i.e., the range of 1.1 to 3.2), it was possible to make the CTE difference equal to 0.0 ppm/° C., make the $ZrO_2$-occupied area ratio fall in the range of 0.9 to 1.6, and prevent cracks in the main body 21 and delamination of the electrode 23.

In Example 24, even if the total content of $ZrO_2$ and $Al_2O_3$ in the electrode 23 was 49.8% by volume and the $Al_2O_3/ZrO_2$ content ratio was 3.8, it was possible to make the CTE difference equal to 0.0 ppm/° C., make the $ZrO_2$-occupied area ratio equal to 1.1, and to prevent cracks in the main body 21 and delamination of the electrode 23.

In Example 25, the MgO content in the main body 21 was 0.1% by mass. The total content of $ZrO_2$ and $Al_2O_3$ in the electrode 23 was 23.6% by volume, and the $Al_2O_3/ZrO_2$ content ratio was 0.5. The other conditions were the same as the conditions in Example 20.

In Example 25, the CTE difference was 0.0 ppm/° C. The Ru—$ZrO_2$ peak ratio was 0.92. The $ZrO_2$-occupied area ratio was 1.8. The resistivity of the electrode 23 was $1.9 \times 10^{-5}$ Ω·cm. Since the CTE difference was small and an uneven distribution of $ZrO_2$ was relatively suppressed in Example 25, neither cracks in the main body 21 nor delamination of the electrode 23 occurred due to the difference in thermal expansion coefficient between the main body 21 and the electrode 23. Besides, the resistivity of the electrode 23 was low. The electrode 23 had an adhesion strength of 59 MPa. Since the adhesion strength was higher than or equal to 50 MPa in Example 25, it was possible to suppress delamination of the electrode 23 from the main body 21 due to factors such as a mechanical shock.

In Example 26, the MgO content in the main body 21 was 0.1% by mass. The other conditions were the same as the conditions in Example 24.

In Example 26, the CTE difference was 0.0 ppm/° C. The Ru—$ZrO_2$ peak ratio as 0.82. The $ZrO_2$-occupied area ratio was 1.1. The resistivity of the electrode 23 was $2.9 \times 10^{-5}$ Ω·cm. Since the CTE difference was small and an uneven distribution of $ZrO_2$ was relatively suppressed in Example 26, neither cracks in the main body 21 nor delamination of the electrode 23 occurred due to the difference in thermal expansion coefficient between the main body 21 and the electrode 23. Besides, the resistivity of the electrode 23 was low. The electrode 23 had an adhesion strength of 250 MPa. Since the adhesion strength was higher than or equal to 90 MPa and relatively high in Example 26, it was possible to favorably suppress delineation of the electrode 23 from the main body 21 due to factors such as a mechanical shock.

Focusing now on Examples 24 and 26, from the viewpoint of increasing the adhesion strength of the electrode 23, the MgO content in the main body 21 was preferably higher than or equal to 0.1% by mass.

In Comparative Example 1, the electrode 23 was formed of only Ru and did not contain $ZrO_2$ and $Al_2O_3$ as described above. The electrode 23 had a thermal expansion coefficient of 7.6 ppm/° C. The other conditions were the same as the conditions in Example 17. Since the CTE difference was 0.5 ppm/° C. and large in Comparative Example 1, cracks in the main body 21 and delamination of the electrode 23 occurred due to the difference in thermal expansion coefficient between the main body 21 and the electrode 23.

In Comparative Example 2, the electrode 23 was formed of Ru and $ZrO_2$ and did not contain $Al_2O_3$ as described above. The $ZrO_2$ content in the electrode 23 was 10.0% by volume, and the electrode 23 had a thermal expansion coefficient of 7.9 ppm/° C. The other conditions were the same as the conditions in Example 1.

In Comparative Example 2, the CTE difference was 0.2 ppm/° C. The Ru—$ZrO_2$ peak ratio was 0.99. The $ZrO_2$-occupied area ratio was 0.2. The resistivity of the electrode 23 was $1.3 \times 10^{-5}$ Ω·cm. Since the $ZrO_2$-occupied area ratio was much lower than 1.0 in Comparative Example 2, an uneven distribution of $ZrO_2$ toward the first member occurred. Accordingly, cracks in the main body 21 and delamination of the electrode 23 occurred due to the difference in thermal expansion coefficient between the main body 21 and the electrode 23.

In Comparative Example 3, the $ZrO_2$ content in the electrode 23 was 17.2% by volume, and the electrode 23 had a thermal expansion coefficient of 8.1 ppm/° C. The other conditions were the same as the conditions in Comparative Example 2.

Figure 5:
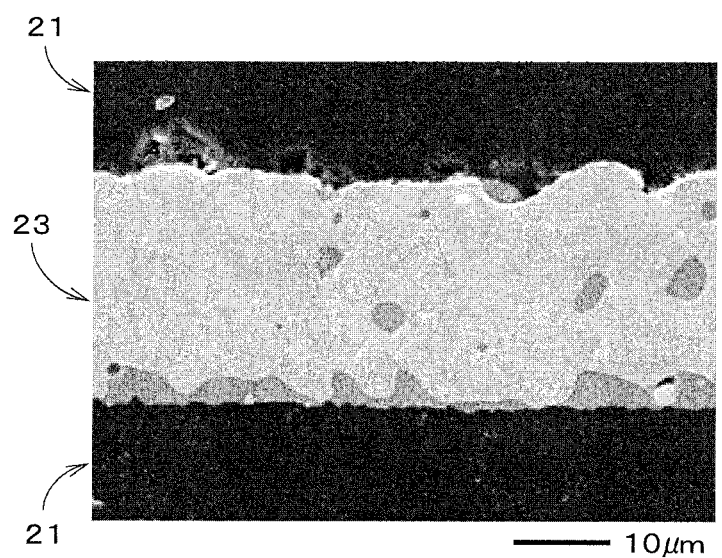
FIG. 5 is an illustration of a sectional SEM image of a composite sintered body according to one comparative example.

In Comparative Example 3, the CTE difference was 0.0 ppm/° C. The Ru—$ZrO_2$ peak ratio was 0.95. The $ZrO_2$-occupied area ratio was 0.2. The resistivity of the electrode 23 was $1.5 \times 10^{-5}$ Ω·cm. Since the $ZrO_2$-occupied area ratio was much lower than 1.0 in Comparative Example 3, and as illustrated in FIG. 5, an uneven distribution of $ZrO_2$ toward the first member (i.e., toward the lower side in FIG. 5) occurred. Accordingly, cracks in the main body 21 and delamination of the electrode 23 occurred due to the difference in thermal expansion coefficient between the main body 21 and the electrode 23.

In Comparative Example 4, the $ZrO_2$ content in the electrode 23 was 27.6% by volume, and the electrode 23 had a thermal expansion coefficient of 8.4 ppm/° C. The other conditions were the same as the conditions in Comparative Example 2.

In Comparative Example 4, the CTE difference was 0.3 ppm/° C. The Ru—$ZrO_2$ peak ratio was 0.81. The $ZrO_2$-occupied area ratio was 0.3. The resistivity of the electrode 23 was $1.8 \times 10^{-5}$ Ω·cm. Since the $ZrO_2$-occupied area ratio was much lower than 1.0 in Comparative Example 4, an uneven distribution of $ZrO_2$ toward the first member occurred. Accordingly, cracks in the main body 21 and delamination of the electrode 23 occurred due to the difference in thermal expansion coefficient between the main body 21 and the electrode 23.

As described above, the composite sintered body 20 includes the base material (in the example described above, the main body 21) containing $Al_2O_3$ as a main component and the electrode 23 arranged inside the base material or on the surface of the base material. The electrode 23 contains Ru, $ZrO_2$, and $Al_2O_3$. This configuration enables suppressing an uneven distribution of $ZrO_2$ in the electrode 23 as shown in Examples 1 to 19. As a result, it is possible to suppress cracks in the base material or delamination father electrode 23 due to the difference in thermal expansion coefficient between the electrode 23 and the base material. Besides, an increase in the resistivity of the electrode 23 can also be suppressed. This enables precisely controlling the amount of heat generated by the electrode 23.

As described above, the absolute value for the difference in thermal expansion coefficient between the electrode 23 and the base material is preferably less than or equal to 0.3 ppm/° C. at temperatures within the range higher than or equal to 40° C. and lower than or equal to 1000° C. This further suppresses cracks in the base material and delamination of the electrode 23 due to the difference in thermal expansion coefficient between the electrode 23 and the base material.

As described above, the resistivity of the electrode 23 at the room temperature is preferably lower than or equal to $3.0×10^{-5}$ Ω·cm. This enables more precisely controlling the amount of heat generated by the electrode 23.

As described above, the total content of $ZrO_2$ and $Al_2O_3$ in the electrode 23 is preferably higher than or equal to 20% by volume. This enables further suppressing an uneven distribution of $ZrO_2$ in the electrode 23 as shown in the comparison between Example 4 and Examples 1, 5, 8, and 9.

As described above, the $Al_2O_3$ content in the electrode 23 is preferably 0.2 times or more and 3.6 times or less the $ZrO_2$ content therein. This enables favorably suppressing an uneven distribution of $ZrO_2$ in the electrode 23.

The $Al_2O_3$ content in the electrode 23 is further preferably more than 3.6 times and less than or equal to 3.8 times the $ZrO_2$ content. Even in this case, it is possible to favorably suppress an uneven distribution of $ZrO_2$ in the electrode 23.

As described above, the total content of Ru, $ZrO_2$, and $Al_2O_3$ in the solid-state material of the electrode 23 is preferably 100% by volume. This enables preventing an increase in manufacturing cost due to an increase in the types of the material for the electrode 23.

As described above, in the electrode 23, the ratio between the main peak intensity of Ru and the main peak intensity of $ZrO_2$ (i.e., Ru—$ZrO_2$ peak ratio), obtained with an X-ray diffraction method, is preferably higher than or quall to 0.80 and lower than 1.0. If the composition ratio of Ru and $ZrO_2$ in the electrode 23 is made within a preferable range, it is possible to favorably reduce the difference in thermal expansion coefficient between the electrode 23 and the base material while suppressing an increase in the resistivity of the electrode 23.

As described above, when a sectional SEM image of the electrode 23 parallel to the thickness direction of the electrode 23 is divided into three pieces in the thickness direction, and these three pieces are respectively referred to as the first region 231, the second region 232, and the third region 233 in order from one side in the thickness direction, the area of $ZrO_2$ in the second region 232 located in the center is preferably 0.5 times or more and 2.0 times or less the area of $ZrO_2$ in the first region 231 located between the second region 232 and the base material. If an uneven distribution of $ZrO_2$ in the electrode 23 is favorably suppressed in this way, it is possible to favorably suppress cracks in the base material and delamination of the electrode 23 due to the difference in thermal expansion coefficient between the electrode 23 and the base material.

As described above, the adhesion strength of the electrode 23 to the base material is preferably higher than or equal to 90 MPa. This enables favorably suppressing delamination of the electrode 23 from the base material due to factors such as a mechanical shock.

As described above, in the composite sintered body 20, it is possible to suppress an uneven distribution of $ZrO_2$ in the electrode 23 and suppress cracks in the base material and delamination of the electrode 23 while suppressing an increase in the resistivity of the electrode 23. Accordingly, the composite sintered body 20 is suitable for use in a semiconductor manufacturing apparatus member to be used in a semiconductor manufacturing apparatus. In particular, the composite sintered body 20 is suitable for use in a semiconductor manufacturing apparatus member to be used in a high-output semiconductor manufacturing apparatus such as a high-power etching device. One preferable example of the semiconductor manufacturing apparatus member generated using the composite sintered body 20 is the susceptor 1 described above. In the susceptor 1, the main body 21 has a disk-like shape and has a main surface on which a substrate 9 is placed, as described above.

A method of producing the composite sintered body 20 includes the step of preparing the first and second members, each being one of a green body, a calcined body, and a sintered body that contains $Al_2O_3$ as a main component (step S11), the step of applying a paste electrode material containing Ru, $ZrO_2$, and $Al_2O_3$ on the first member and drying the electrode material (step S13), the step of laminating the second member on the first member to form a laminate (step S14), and the step of firing the laminate by hot pressing (step S15). Accordingly, it is possible suppress an uneven distribution of $ZrO_2$ in the electrode 23 in the same manner as described above. As a result, it is possible to suppress cracks in the base material and delamination of the electrode 23 due to the difference in thermal expansion coefficient between the electrode 23 and the base material.

As described above, this production method enables suppressing an uneven distribution of $ZrO_2$ in the electrode 23. This production method is thus in particular suitable for use in the case where the first member in step S11 is either a calcined body or a tape cast that can relatively easily absorb the electrode paste.

As described above, the absolute value for the difference in thermal expansion coefficient between the electrode 23 and the first member after completion of step S15 is preferably less than or equal to 0.3 ppm/° C. at temperatures within the range higher than or equal to 40° C. and lower than or equal to 1000° C. This enables further suppressing cracks in the base material and delamination of the electrode 23 due to the difference in thermal expansion coefficient between the electrode 23 and the base material.

As described above, the firing temperature in step S15 is preferably higher than or equal to 1550° C. and lower than or equal to 1650° C. The firing conducted at temperatures within this range enables suppressing an increase in the degree of roughness of $ZrO_2$ domains accompanied with grain growth of Ru in the electrode 23 while allowing sufficient firing of the base material (in the above example, the main body 21). As a result, it is possible to stabilize the characteristics of the electrode 23.

The composite sintered body 20, the semiconductor manufacturing apparatus member, and the method of producing the composite sintered body 20 described above may be modified in various ways.

For example, the CTE difference in the composite sintered body 20 may be larger than 0.3 ppm/° C.

The resistivity of the electrode 23 at the room temperature may be higher than $3.0×10^{-5}$ Ω·cm.

The total content of $ZrO_2$ and $Al_2O_3$ in the electrode 23 may be lower than 20% by volume.

The $Al_2O_3/ZrO_2$ content ratio in the electrode 23 may be lower than 0.2, or may be higher than 3.8.

The total content of Ru, $ZrO_2$, and $Al_2O_3$ in the solid-state material of the electrode 23 may be lower than 100% by volume.

The Ru—$ZrO_2$ peak ratio in the electrode 23 may be lower than 0.80.

The $ZrO_2$-occupied area ratio may be lower than 0.5, or may be higher than 2.0.

The adhesion strength of the electrode 23 to the base material may be lower than 90 MPa, or may be lower than 50 MPa.

In the method of producing the composite sintered body 20, the firing temperature in step S15 described above may be lower than 1550° C., or may be higher than 1650° C.

The composite sintered body 20 may be produced by a method different from the method of production described above.

The composite sintered body 20 may be used to produce semiconductor manufacturing apparatus members (e.g., rings or shower heads) other than the susceptor 1 provided in semiconductor manufacturing apparatuses. As another alternative, the composite sintered body 20 may be used to produce members for use in apparatuses other than semiconductor manufacturing apparatuses. For example, the composite sintered body 20 may be used to produce a susceptor that supports a substrate other than a semiconductor substrate, or may be used to produce a ceramic heater that heats a target object.

The configurations of the preferred embodiments and variations described above may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention.

INDUSTRIAL APPLICABILITY

The present invention is applicable in fields relating to semiconductor manufacturing apparatuses, such as the production of a susceptor that holds and heats a semiconductor substrate.

REFERENCE SIGNS LIST

1 Susceptor
9 Substrate
20 Composite sintered body
21 Main body
23 Electrode
231 First region
232 Second region
233 Third region
S11 to S15 Step

The invention claimed is:

1. A composite sintered body comprising:
a base material that contains aluminum oxide as a main component; and
an electrode arranged inside said base material or on a surface of said base material,
wherein said electrode contains:
ruthenium;
zirconium oxide; and
aluminum oxide,
wherein a content of said aluminum oxide in said electrode is 0.2 times or more and 3.8 times or less a content of said zirconium oxide in said electrode.

2. The composite sintered body according to claim 1, wherein
an absolute value for a difference in thermal expansion coefficient between said electrode and said base material is less than or equal to 0.3 ppm/° C. at a temperature within a range higher than or equal to 40° C. and lower than or equal to 1000° C.

3. The composite sintered body according to claim 1, wherein
said electrode has resistivity lower than or equal to $3.0 \times 10^{-5}$ Ω·cm at a room temperature.

4. The composite sintered body according to claim 1, wherein
a total content of said zirconium oxide and said aluminum oxide in said electrode is higher than or equal to 20% by volume.

5. The composite sintered body according to claim 1, wherein
a total content of said ruthenium, said zirconium oxide, and said aluminum oxide in a solid-state material of said electrode is 100% by volume.

6. The composite sintered body according to claim 1, wherein
a ratio between a main peak intensity of said ruthenium and a main peak intensity of said zirconium oxide in said electrode is higher than or equal to 0.80 and lower than 1.0, the ratio being obtained by X-ray diffractometry.

7. The composite sintered body according to claim 1, wherein
when a sectional SEM image of said electrode that is taken parallel to a thickness direction of said electrode is divided into three equal parts and if the three equal parts are respectively referred to as a first region, a second region, and a third region in order from one side in the thickness direction, an area of said zirconium oxide in said second region located in a center is 0.5 times or more and 2.0 times or less the area of said zirconium oxide in said first region located between said second region and said base material.

8. The composite sintered body according to claim 1, wherein
an adhesion strength of said electrode to said base material is higher than or equal to 90 MPa.

9. A semiconductor manufacturing apparatus member for use in a semiconductor manufacturing apparatus, being prepared using the composite sintered body according to claim 1, wherein
said base material has a disk-like shape and has a main surface on which a semiconductor substrate is placed.

10. A method of producing a composite sintered body, comprising:
a) preparing a first member and a second member that are each one of a green body, a calcined body, and a sintered body that contains aluminum oxide as a main component;
b) drying said first member by application of a paste electrode material that contains ruthenium, zirconium oxide, and aluminum oxide to said first member;
c) laminating said second member on said first member to form a laminate; and
d) firing said laminate by hot pressing,
wherein a content of said aluminum oxide in an electrode formed from said electrode material by said operation d) is 0.2 times or more and 3.8 times or less a content of said zirconium oxide in said electrode.

11. The method of producing a composite sintered body, according to claim 10, wherein
said first member in said operation a) is either a calcined body or a tape cast.

12. The method of producing a composite sintered body, according to claim 10, wherein
an absolute value for a difference in thermal expansion coefficient between said electrode and said first member after completion of said operation d) is less than or equal to 0.3 ppm/° C. at a temperature within a range higher than or equal to 40° C. and lower than or equal to 1000° C.

13. The method of producing a composite sintered body, according to claim 10, wherein
a firing temperature in said operation d) is higher than or equal to 1550° C. and lower than or equal to 1650° C.

* * * * *